(12) United States Patent
Asada et al.

(10) Patent No.: US 6,635,971 B2
(45) Date of Patent: Oct. 21, 2003

(54) ELECTRONIC DEVICE AND OPTICAL TRANSMISSION MODULE

(75) Inventors: Toyoki Asada, Yokohama (JP); Yuji Fujita, Yokohama (JP); Hideo Sotokawa, Yokohama (JP); Kazumi Kawamoto, Yokohama (JP); Kunio Matsumoto, Koshigaya (JP); Shinya Hamagishi, Fujisawa (JP); Mari Matsuyoshi, Yokohama (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/042,270

(22) Filed: Jan. 11, 2002

(65) Prior Publication Data

US 2002/0090162 A1 Jul. 11, 2002

(30) Foreign Application Priority Data

Jan. 11, 2001 (JP) .................................. 2001-003190
Jul. 11, 2001 (JP) .................................. 2001-210151

(51) Int. Cl.⁷ .............................................. H01L 23/29
(52) U.S. Cl. ...................... 257/789; 257/788; 257/790; 257/795
(58) Field of Search ........................ 257/778, 787–795; 438/108, 112, 124, 126, 127

(56) References Cited

U.S. PATENT DOCUMENTS

| 5,300,459 A | * | 4/1994 | Ushikubo et al. ............ 438/126 |
| 6,220,764 B1 | * | 4/2001 | Kato et al. ..................... 385/92 |
| 6,448,665 B1 | * | 9/2002 | Nakazawa et al. .......... 257/789 |

\* cited by examiner

Primary Examiner—David Nelms
Assistant Examiner—Long Tran
(74) Attorney, Agent, or Firm—Antonelli, Terry, Stout & Kraus, LLP

(57) ABSTRACT

An electronic device, in which terminals of a semiconductor integrated circuit chip and terminals of a circuit substrate are mounted with solder so as to face one another. The electronic device includes a first resin, which is disposed between the circuit substrate and a terminal formation face of the semiconductor integrated circuit chip and a second resin, which is disposed at the outer perimeter of the semiconductor integrated circuit chip or is disposed laterally thereon. The modulus of elasticity of the second resin is smaller than the modulus of elasticity of the first resin, the modulus of elasticity of the second resin is at least 0.5 GPa but not more than 28 GPa at room temperature.

6 Claims, 10 Drawing Sheets

ELECTRONIC DEVICE AND OPTICAL TRANSMISSION MODULE

BACKGROUND OF THE INVENTION

The present invention relates to an electronic device comprising a circuit substrate to which a semiconductor integrated circuit chip is connected by means of a flip chip method employing solder, and to an optical transmission module.

Soldering is widely employed in the assembly of conventional electronic components (devices). However, due to the need to make electronic devices highly dense, miniature and thin, reduction in terminal pitch is progressing rapidly as a result of miniaturization and of an increase in the number of package connecting terminals, but there have been difficulties with conventional soldering techniques in supplying solder accurately to minute electrodes.

Connection techniques for directly mounting a semiconductor integrated circuit chip on a circuit substrate have been developed, among which flip chip method connections (flip chip connections), in which an active chip face of a semiconductor integrated circuit chip is mounted so as to be oriented downward to face a circuit substrate, have become a prominent fabrication method that serves as a means of realizing an improvement in electrical characteristics and structural density.

However, with such a flip chip connection, since the thermal expansion coefficient of the circuit substrate is large in comparison with that of a semiconductor integrated circuit chip, the application of heat leads to a marked change in the shape of the circuit substrate and, in turn, to an increase in the stress on the connection portion thereof, which sometimes results in the connection breaking.

For this reason, conventional flip chip connections employ a resin between the semiconductor integrated circuit chip and the circuit substrate in order to reduce the extent of any change in the substrate shape, to thereby prevent the connection from being broken.

One example of such a flip chip connection is disclosed in Japanese Patent Application Laid-open No. H9-107003. The structure of this publication employs a circuit substrate that has substrate electrodes disposed so as to be capable of electrical connection with protruding electrodes, an electrically conductive binding agent being interposed between the protruding electrodes and these substrate electrodes, and a resin being interposed between the semiconductor integrated circuit chip and the circuit substrate. The process described in this publication forms protruding electrodes for terminal electrodes of the semiconductor integrated circuit chip, and an electrically conductive binding agent is affixed to the tips of these protruding electrodes using a transfer method. Here, the transfer method is a method according to which protruding electrodes are pressed into an electrically conductive binding agent which is contained in a container to a predetermined depth, and, upon vertically raising these protruding electrodes, the electrically conductive binding agent of a predetermined depth is transferred to the protruding electrodes. Next, a resin is applied to the section of the circuit substrate upon which the semiconductor integrated circuit chip is mounted, and the semiconductor integrated circuit chip is mounted atop the circuit substrate from above the resin and then is heat-cured.

In addition, another flip chip method is disclosed in Japanese Patent Application Laid-open No. H8-172114. The structure described in this publication is constituted by forming protruding electrodes for terminals of a semiconductor integrated circuit chip, and solder is employed for the electrodes of the semiconductor substrate, which solder is melted and connected to the protruding electrodes. The process described in this publication involves forming protruding electrodes for terminal electrodes of the semiconductor integrated circuit chip, applying resin to the section on the circuit substrate upon which this semiconductor integrated circuit chip is to be mounted, mounting the semiconductor integrated circuit chip from above the resin, and applying pressure to and heating the semiconductor integrated circuit chip.

Figure 5:
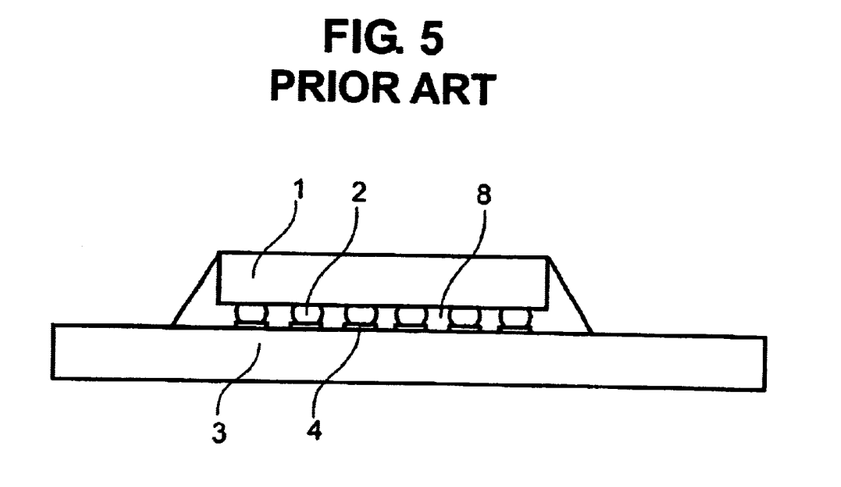
FIG. 5 is a partial sectional view of an electronic substrate applied to a conventional electronic device.

These conventional flip chip connection structures are such that, as shown in FIG. 5, one variety of resin 8 is employed to bind a semiconductor integrated circuit chip 1 and a circuit substrate 3, such that the resin 8 provided between the semiconductor integrated circuit chip 1 and the circuit substrate 3, and the resin 8 provided at the outer perimeter of the semiconductor integrated circuit chip are the same, there being no particular regulation of the modulus of elasticity of the resin.

Figure 8:
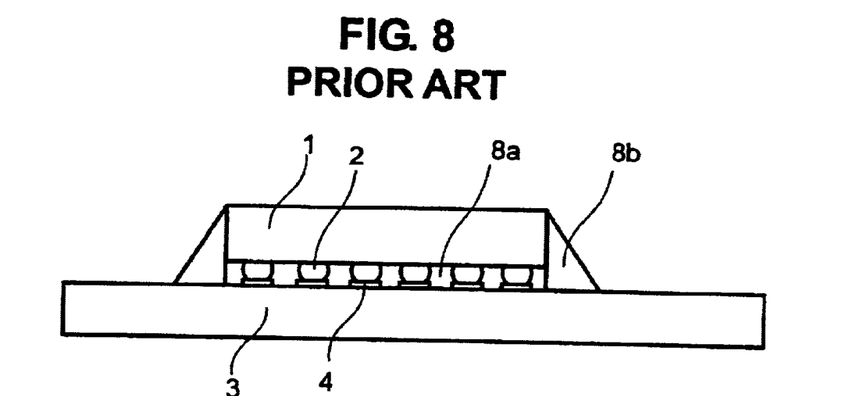
FIG. 8 is a partial sectional view of an electronic substrate applied to a conventional electronic device.
Figure 9:
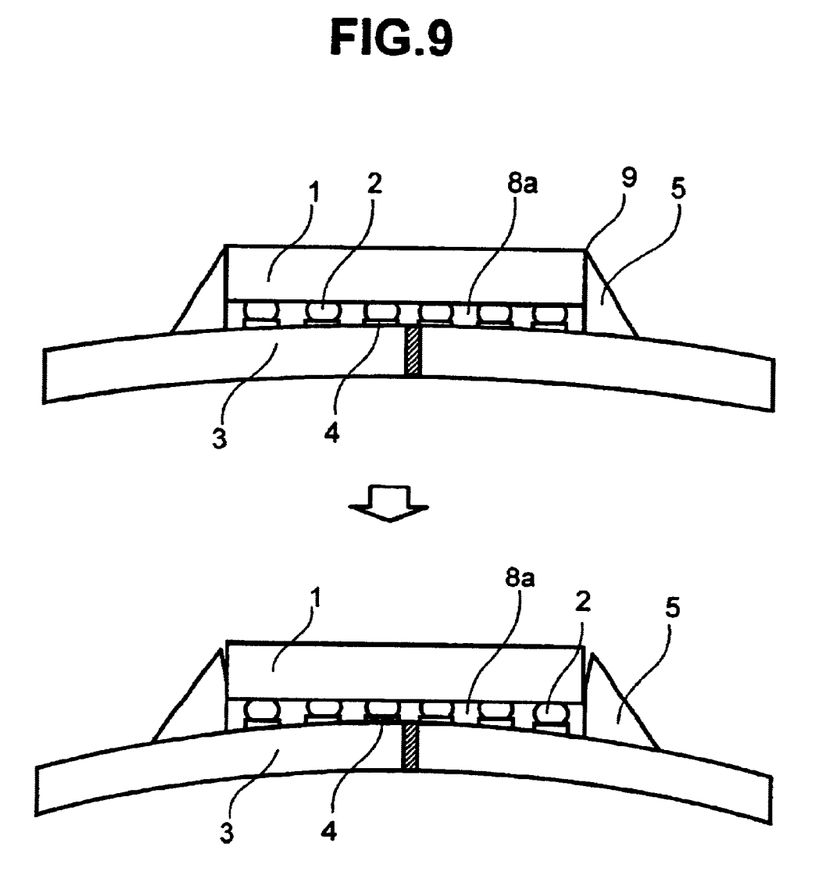
FIG. 9 is a partial sectional view showing the progressive change in shape of an electronic substrate applied to an electronic device.

Further, as shown in FIG. 8, one example, in which a resin 8a is provided between the semiconductor integrated circuit chip 1 and the circuit substrate 3 and a different resin 8b is provided at the outer perimeter of the semiconductor integrated circuit chip, is disclosed in the Japanese Patent Application Laid-open No. 2000-327884. This publication features the use of a resin 8a provided between the semiconductor integrated circuit chip 1 and the circuit substrate 3 that contains: (A) epoxy resin: 100 parts by weight, (B) polyorgano silsequioxane 100 to 300 parts by weight, and (C) curing accelerator: 0.01 to 10 parts by weight, and a resin 8b provided at the outer perimeter of the semiconductor integrated circuit chip 1, which is subject to no particular limitations, but for which preferred materials are: epoxy resins, epoxy resins having the same components as the resin 8a provided between the semiconductor integrated circuit chip 1 and the circuit substrate 3, and epoxy resins having an expansion coefficient below the glass transition temperature of no more than 20 ppm/° C.

Furthermore, another example in which a resin 8a is provided between a semiconductor integrated circuit chip 1 and a circuit substrate 3, and a different resin 8b is provided at the outer perimeter of the semiconductor integrated circuit chip 1 is disclosed in the Japanese Patent Application Laid-open No. 2001-35884. This publication features the provision of a resin film between the semiconductor integrated circuit chip 1 and the circuit substrate 3, and a method of covering the outer perimeter of the semiconductor integrated circuit chip 1 or the whole of the semiconductor integrated circuit chip 1 with an insulating resin.

Further, a structure, which is related to the present invention, appears in Japanese Patent Application Laid-open No. H4-137641.

SUMMARY OF THE INVENTION

The techniques disclosed in the above-referenced Japanese Patent Application Laid-open No. H8-172114 and Japanese Patent Application Laid-open No. H9-107003 exhibit problems outlined below due to the fact that one variety of resin is employed for the binding of a semiconductor integrated circuit chip and a circuit substrate, such that the resin provided between the semiconductor integrated circuit chip and the circuit substrate, and the resin provided at the outer perimeter of the semiconductor integrated circuit chip are the same.

Figure 6:
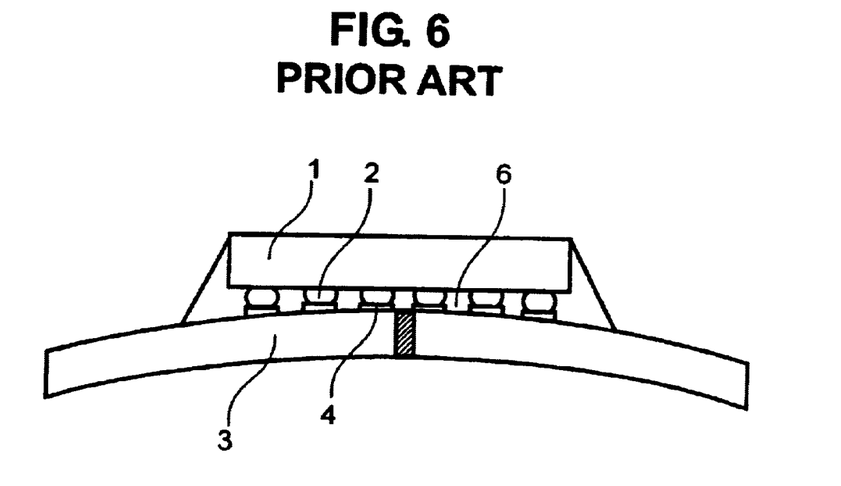
FIG. 6 is a partial sectional view of an electronic substrate applied to a conventional electronic device.

In other words, in a case where a resin 6 of low elasticity is employed as the resin, as shown in FIG. 6, when heat is applied, the resin 6 of low elasticity cannot restrain a change in shape of the circuit substrate 3, such that the circuit substrate 3 changes greatly in shape, and, as a result of the change in shape of the circuit substrate 3, the connection portion is subjected to stress, which results in the connection breaking within a short time.

Figure 7:
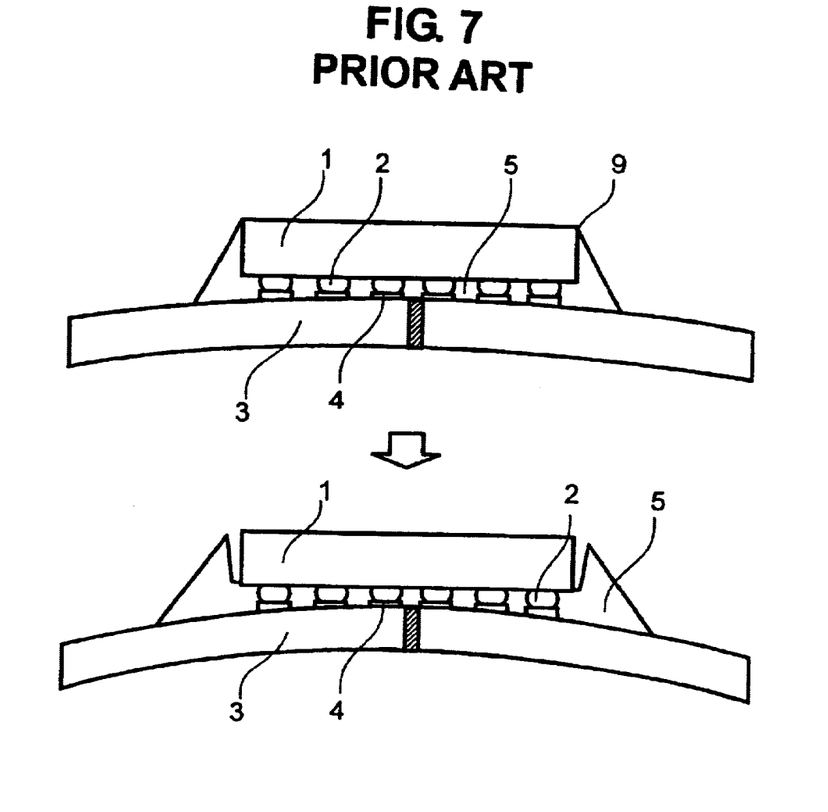
FIG. 7 is a partial sectional view showing the progressive change in shape of an electronic substrate applied to a conventional electronic device.

In addition, in a case where a resin of high elasticity 5 is employed as the resin, as shown in FIG. 7, when heat is applied, the resin of high elasticity 5 restrains a change in shape of the circuit substrate 3, such that the change in shape of the circuit substrate 3 is limited. However, the stress on the edge portions 9 of the semiconductor integrated circuit chip is large. Further, separation occurs at the interface between the lateral faces of the semiconductor integrated circuit chip 1 and the resin 8b at the outer perimeter of the semiconductor integrated circuit chip. Further, when no such separation occurs at the interface between the lateral faces of the semiconductor integrated circuit chip and the resin 8b at the outer perimeter of the semiconductor integrated circuit chip, the extent of the change in shape of the circuit substrate is relatively large, which means that there is a great amount of stress on the connection portion, which results in the connection breaking.

Furthermore, the techniques described in Japanese Patent Application Laid-open No. 2000-327884 and Japanese Patent Application Laid-open No. 2001-35884 mentioned above, which feature a constitution in which the resin employed between the semiconductor integrated circuit chip and the circuit substrate is different from the resin employed at the outer perimeter of the semiconductor integrated circuit chip, exhibit the problems outlined below.

The approach outlined in Japanese Patent Application Laid-open No. 2000-327884 does not feature any regulation of the resin at the outer perimeter of the semiconductor integrated circuit chip, but rather only features resins as being preferred, namely: epoxy resins, epoxy resins having the same components as the resin provided between the semiconductor integrated circuit chip and the circuit substrate, and epoxy resins having an expansion coefficient below the glass transition temperature of no more than 20 ppm/° C. Japanese Patent Application Laid-open No. 2001-35884 only features, as the insulating resin at the outer perimeter of the semiconductor integrated circuit chip, epoxy resins, epoxy acrylate resins, and silicone resins.

In other words, the above publications do not consider the relationship between the modulus of elasticity of the resin provided between the semiconductor integrated circuit chip and the circuit substrate, and the modulus of elasticity of the resin provided at the outer perimeter of the semiconductor integrated circuit chip (or laterally thereon).

Therefore, in the above-mentioned conventional flip chip connections, when a resin 5 of high elasticity is employed at the outer perimeter of the semiconductor integrated circuit chip, the circuit substrate 3 changes in shape as a result of thermal stress, the stress on the edge portions 9 of the semiconductor integrated circuit chip becomes large, and, within a short time, separation occurs at the interface between the lateral faces of the semiconductor integrated circuit chip 1 and the resin 5 provided at the outer perimeter of the semiconductor integrated circuit chip. Therefore, there is a reduction in the restraining force of the resin 5 provided at the outer perimeter of the semiconductor integrated circuit chip that restrains the circuit substrate 3, and the extent of the change in shape of the circuit substrate 3 increases, meaning that the connection portion is subjected to stress, which results in the connection breaking.

Further, a structure is featured in the Japanese Patent Application Laid-open No. H4-137641 that is similar to the structure of the present invention, but that cannot handle heat cycles like those of the present invention.

Furthermore, the present inventors established that the above problems were prominent as a result of applying such a flip chip connection using solder to the mounting of the Driver IC of an optical transmission module, which constitutes one kind of electronic device. This is the case since, unlike other electronic devices, optical transmission modules are widely installed in the ground, on telephone poles or in other locations outdoors, and, unlike other electronic devices, are exposed to heat cycles with severe temperature differences. As a result, in consideration of the above characteristics, the present inventors have devised an optical transmission module, which, even in a case of carrying out a flip chip connection employing solder for the mounting of a Driver IC on a circuit substrate, is highly durable.

In other words, it is an object of the present invention to improve the durability of an electronic device, and, more particularly, the durability of an optical transmission module, by improving the durability to heat cycles of a flip chip connection between a semiconductor integrated circuit chip and an electronic substrate.

An example of an embodiment of an electronic device that is capable of resolving such problems is an electronic device, in which terminals of a semiconductor integrated circuit chip and terminals of a circuit substrate are mounted with solder so as to face one another, whose structure comprises: a first resin, which is disposed between the circuit substrate and a terminal formation face of the semiconductor integrated circuit chip, and a second resin, which is disposed at the outer perimeter of the semiconductor integrated circuit chip, or is disposed laterally thereon, and in which structure the modulus of elasticity employed for the second resin is smaller than the modulus of elasticity for the first resin.

Therefore, when a resin of low elasticity is provided between the semiconductor integrated circuit chip and the circuit substrate, because the extent of the thermally induced shape change of the circuit substrate is then limited, it is possible to make the stress on or warping of the connection portion of the semiconductor integrated circuit chip and the circuit substrate small.

When a resin of high elasticity is provided at the outer perimeter of the semiconductor integrated circuit chip or laterally thereon, as a result of binding using a second resin, even if the thermal stress increases and the circuit substrate changes in shape, since it is possible to thus make the stress acting on the edge portions of the semiconductor integrated circuit chip small, separation between the lateral faces of the semiconductor integrated circuit chip and the resin can be prevented.

This means that it is possible to keep the extent of the change in shape of the circuit substrate small and thereby improve the connection reliability.

Therefore, in order to realize both such effects, according to the present invention, a flip chip structure which comprises a first resin and a second resin is employed, and, furthermore, resins are selected such that the first resin is a resin with higher modulus of elasticity than the modulus of elasticity of the second resin.

Further, the manufacturing method for this electronic device may be one that includes the following steps:

(1) A resin of high elasticity is applied beforehand to the center portion of the position on the circuit substrate in which a semiconductor integrated circuit chip is to be mounted, and the protruding electrodes of the semiconductor integrated circuit chip and the substrate electrodes are aligned.

(2) Following step (1), the semiconductor integrated circuit chip is mounted atop the circuit substrate.

(3) Following step (2), the semiconductor integrated circuit chip and the circuit substrate are heated and the resin of high elasticity is cured by means of a bonding tool to which the semiconductor integrated circuit chip is adsorbed and by means of a substrate stage whereon the circuit substrate is mounted.

(4) Following step (3), a resin of low elasticity is applied to the outer perimeter of the semiconductor integrated circuit chip, and this resin of low elasticity is cured and formed in fillet shapes at the outer perimeter of or laterally on the semiconductor integrated circuit chip.

DESCRIPTION OF THE PREFERRED EMBODIMENTS

The present invention will now be described with reference to the drawings.

Figure 1:
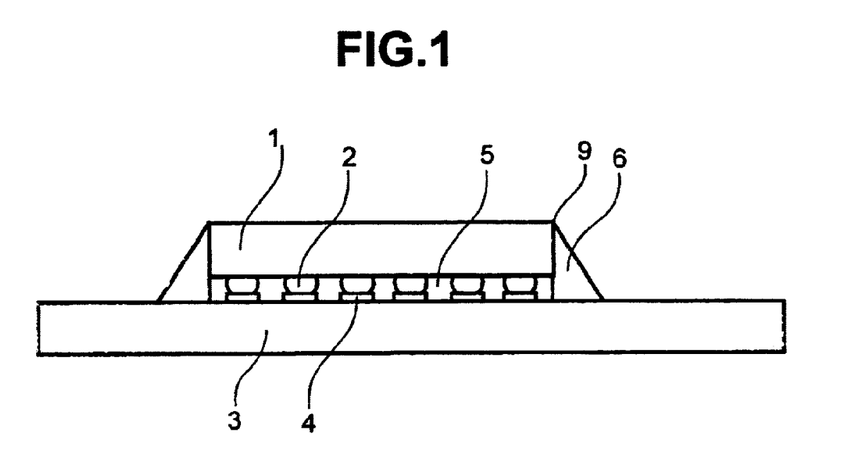
FIG. 1 is a partial sectional view of an electronic substrate applied to the electronic device of the present invention.
Figure 2:
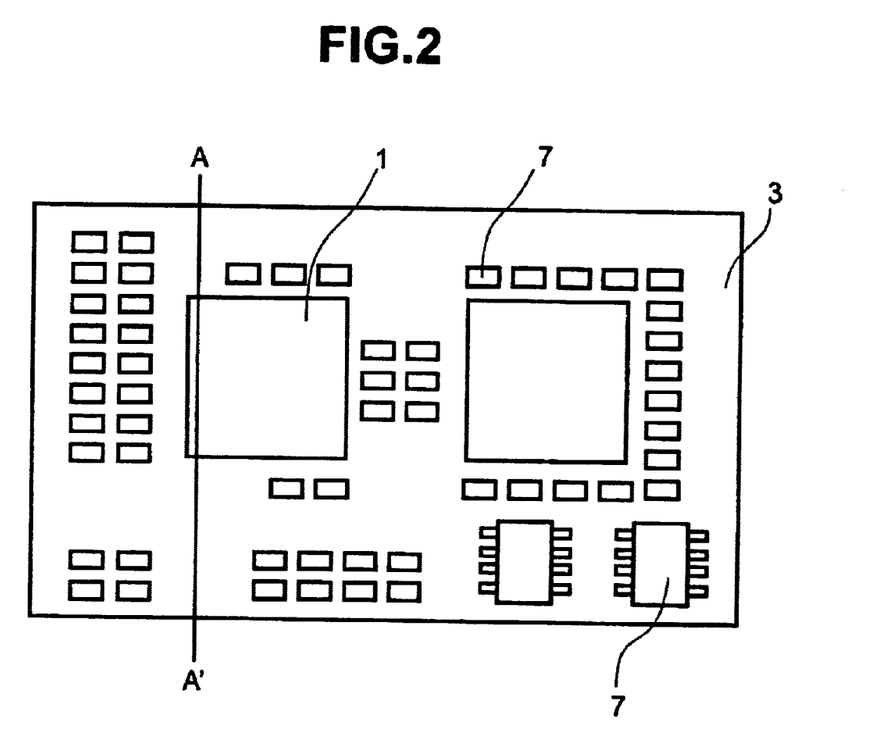
FIG. 2 is a top view of the whole of the electronic substrate applied to the electronic device of the present invention.

A cross-sectional view showing the condition in which a semiconductor integrated circuit chip is mounted on an electronic substrate is shown in FIG. 1, a top view of the whole of the substrate being shown in FIG. 2.

FIG. 1 shows is a semiconductor integrated circuit chip 1; a protruding electrode 2 of the semiconductor integrated circuit chip (in a condition after solder balls have been mounted for chip terminals); a circuit substrate 3; a substrate electrode 4; a resin of high elasticity 5; a resin 6 of low elasticity; and an edge portion 9 of the semiconductor integrated circuit chip.

As shown in this figure, the electronic substrate applied to the electronic device of the present invention is constructed such that the electrodes of a circuit substrate 3 formed with an electric circuit pattern, and a semiconductor integrated circuit chip 1, which connects electrically with the electrodes of the circuit substrate 3, are connected with solder using a flip chip method. A resin 6 of high elasticity is applied across multiple faces of the semiconductor integrated circuit chip 1, and the outer perimeter or lateral faces of the semiconductor integrated circuit chip 1 is/are covered with a resin 5 of low elasticity.

Therefore, when a large amount of the resin 5 of low elasticity is at the outer perimeter of the semiconductor integrated circuit chip 1 and the resin 6 of high elasticity fills the space below the semiconductor integrated circuit chip 1, it is possible to prevent a temperature-induced variation in the shape of the circuit substrate 3, and it is possible to put a stop to localized contact faults when flip chip connection is performed.

Moreover, with a view to improving the connection reliability in terms of wettability, or the like, the material of the protruding electrodes 2 may have a layered structure of gold and solder.

Further, comparing two varieties of resin at are a resin 5 of high elasticity and a resin 6 of low elasticity whose moduli of elasticity differ, at room temperature, the modulus of elasticity of the resin 5 of high elasticity is high, and the modulus of elasticity of the resin 6 of low elasticity is low. In other words, the resin 5 of high elasticity is a resin whose modulus of elasticity is higher than the resin 6 of low elasticity employed at the outer perimeter of the semiconductor integrated circuit chip 1. The resin 5 of high elasticity and the resin 6 of low elasticity are preferably materials whose structure is principally formed from epoxy. Also, the modulus of elasticity of the resin 6 of low elasticity is preferably the same as or lower than the modulus of elasticity of the circuit substrate 3, and, more specifically, it is preferably between 0.5 GPa and 28 GPa. Further, the modulus of elasticity of the resin 6 of low elasticity is preferably no more than 24 GPa, more preferably between 1 GPa and 20 GPa, and particularly preferably between 4 GPa and 15 GPa. It goes without saying that the resin 5 of high elasticity ideally has a modulus of elasticity that is higher than the modulus of elasticity of the resin 6 of low elasticity employed at the outer perimeter of semiconductor integrated circuit chip 1. However, at room temperature, this modulus of elasticity is preferably between the modulus of elasticity of the circuit substrate 3 and the modulus of elasticity of the chip, and more specifically, the modulus of elasticity at room temperature is preferably 28 GPa and 150 GPa. Further, this modulus of elasticity is a value calculated based on JISK-7113.

As in FIG. 1, the structure of the electronic substrate applied to the electronic device of the present invention employs the resin 6 of low elasticity at the outer perimeter of the semiconductor integrated circuit chip 1 such that, even if there is an increase in thermal stress and the circuit substrate 3 changes in shape, the perimeter (particularly the outer perimeter) of the semiconductor integrated circuit chip 1 is bonded using the resin 6 of low elasticity, meaning that it is possible to make the stress on the edge portions 9 of the semiconductor integrated circuit chip small, and, since it is possible to keep the extent of the shape change of the circuit substrate 3 over a long period small in order that no separation should occur between the lateral faces of the semiconductor integrated circuit chip 1 and the resin 6 of low elasticity, the connection reliability can be improved in comparison with a conventional flip chip structure.

Figure 10:
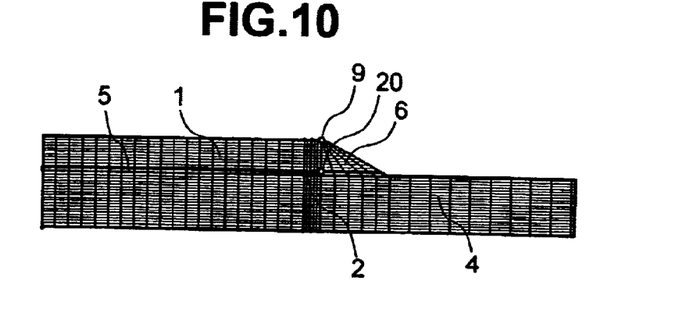
FIG. 10 is a diagram which shows a stress analysis model.
Figure 11:
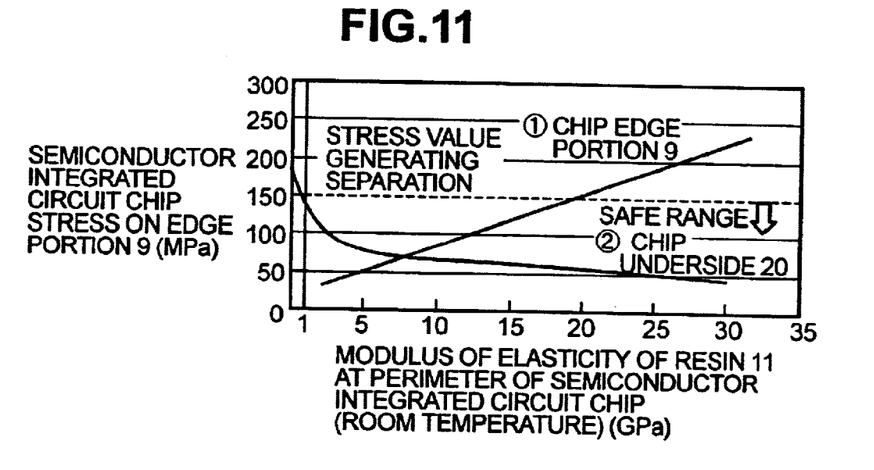
FIG. 11 is a graph which shows the relationship between the stress on the edge portions of a semiconductor integrated circuit chip and the modulus of elasticity of the resin employed at the outer perimeter of the semiconductor integrated circuit chip.
Figure 12:
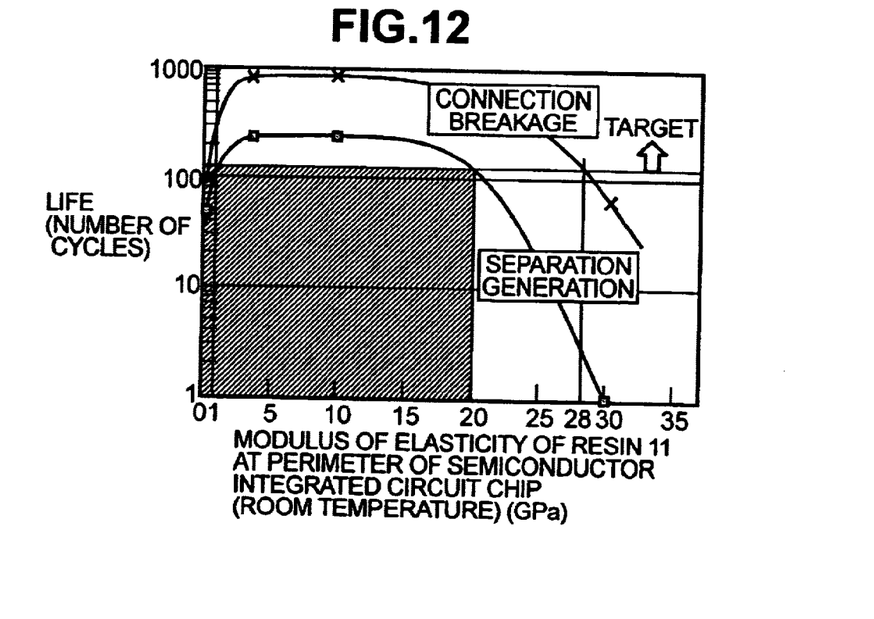
FIG. 12 is a graph which shows the relationship between the modulus of elasticity of the resin employed at the outer perimeter of the semiconductor integrated circuit chip and an acceleration test.

FIGS. 10, 11 and 12 serve to illustrate the effects of the present invention.

FIG. 10 shows a stress analysis model. As shown in FIG. 10, the constitution for this stress analysis model consists of: a circuit substrate with a thickness of 0.8 mm; a semiconductor integrated circuit chip 1 with a thickness of 0.45 mm and a breadth of 4 mm; a protruding electrode (bump) 2 with a thickness of 0.05 mm; a resin 5 of high elasticity with a thickness of 0.05 mm; and a resin 6 of low elasticity of aspect ratio 0.5 with a thickness of 5 mm and a breadth of 4 mm. The specific arrangement is as per FIG. 1.

The results of the stress analysis using the model of FIG. 10 are shown in FIG. 11.

As shown in FIG. 11, it can be seen that, as the modulus of elasticity of the resin 6 employed at the outer perimeter of the semiconductor integrated circuit chip increases, there tends to be an increase in the stress on the chip edge portions 9 of the semiconductor integrated circuit chip. Further, it can be seen that, as the modulus of elasticity of the resin 6 employed at the outer perimeter of the semiconductor integrated circuit chip decreases, there tends to be an increase in the stress on the underside 20 of the semiconductor integrated circuit chip.

In order to define a range for the modulus of elasticity of the resin 6 provided at the outer perimeter of the semiconductor integrated circuit chip 1, a thermal shock endurance test was undertaken with heat cycles of −25 to 125° C., using the model of FIG. 10. By undertaking the thermal test with heat cycles of −55 to 125° C., the rate of acceleration of the thermal shock endurance test was sought using the Coffin-Manson heat fatigue life prediction relation (n=5.21), and, with a temperature change resulting from this rate of acceleration during operation of the optical transmission module (ΔT25 ° C./day), a thermal shock endurance test target value, permitting the fulfillment of a requirement for an optical transmission module target life of 200,000 hours, was set at 120 cycles.

These results were used to seek the relationship between the stress, for a given number of test cycles, on the semiconductor integrated circuit chip, and the modulus of elasticity of the resin provided at the outer perimeter of the semiconductor integrated circuit chip, which relationship is shown in FIG. 12.

It can be seen from FIG. 12 that, in order to fulfil the requirement that, in the course of the target 120 cycles, the solder connection should not break, the modulus of elasticity of the resin provided at the outer perimeter of the semiconductor integrated circuit chip ideally should be between 0.5 GPa and 28 GPa. Further, in order to fulfil the requirement that, in the course of the target 120 cycles, no separation should occur, the modulus of elasticity of the resin 6 of low elasticity provided at the outer perimeter of the semiconductor integrated circuit chip, at room temperature, should be between 1 GPa and 20 GPa, and most preferably is between 4 GPa and 15 GPa.

Further, in the above embodiment, two varieties of resin were employed, namely the resin 5 of high elasticity and the resin 6 of low elasticity. However, by changing the curing method and curing conditions, one resin may be used to prepare a resin 5 of high elasticity and a resin 6 of low elasticity whose moduli of elasticity differ.

In addition, thus far, the description has principally been directed to the mounting of a semiconductor integrated circuit chip 1. However, needless to say, the present invention is not limited to the semiconductor integrated circuit chip 1, but rather may also be applied to a different semiconductor integrated circuit chip which is to be mounted on a circuit substrate 3.

Further, needless to say, the flip chip structural body employed by an optical transmission module of the present invention can be used for a high-end computer or a server, which are devices requiring high reliability.

Figure 3:
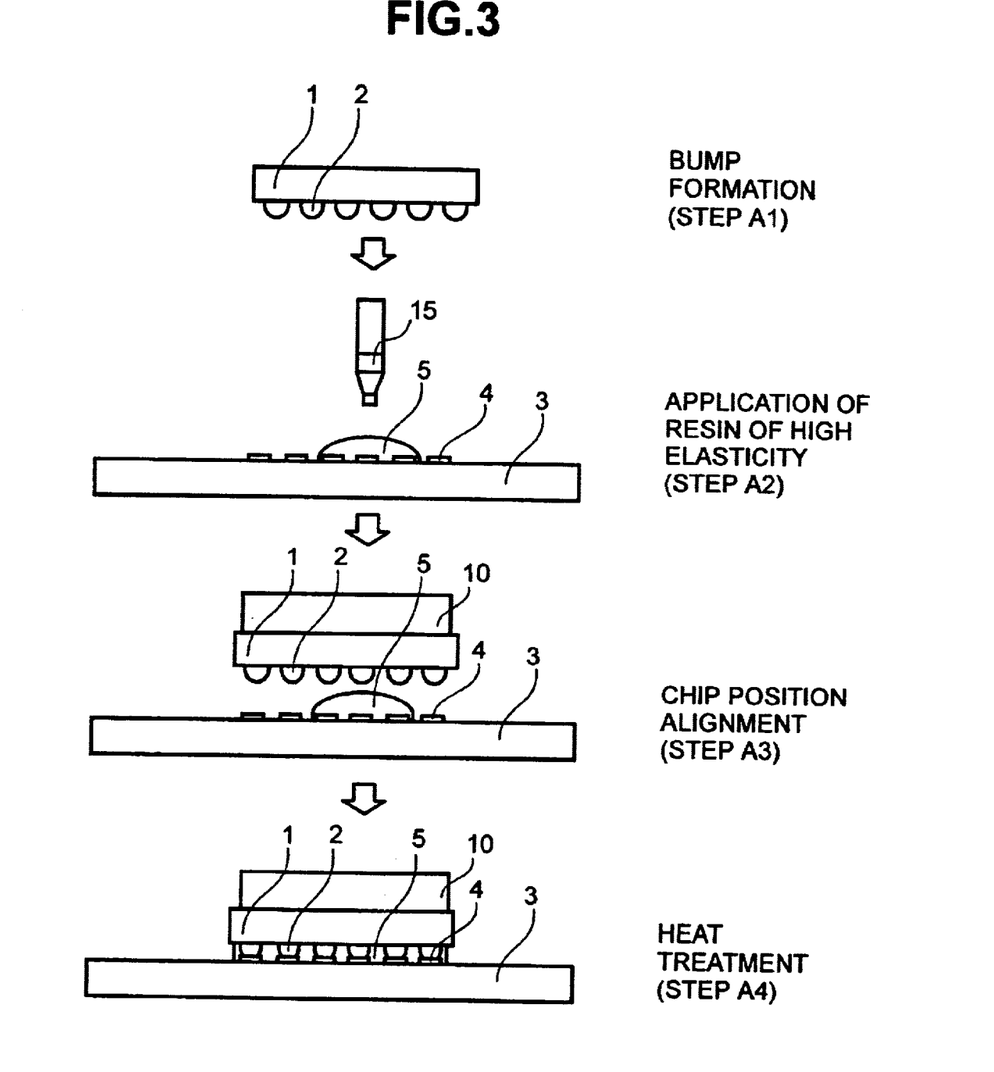
FIG. 3 is a process flow diagram which shows a chip mounting process of an embodiment of the present invention.
Figure 4:
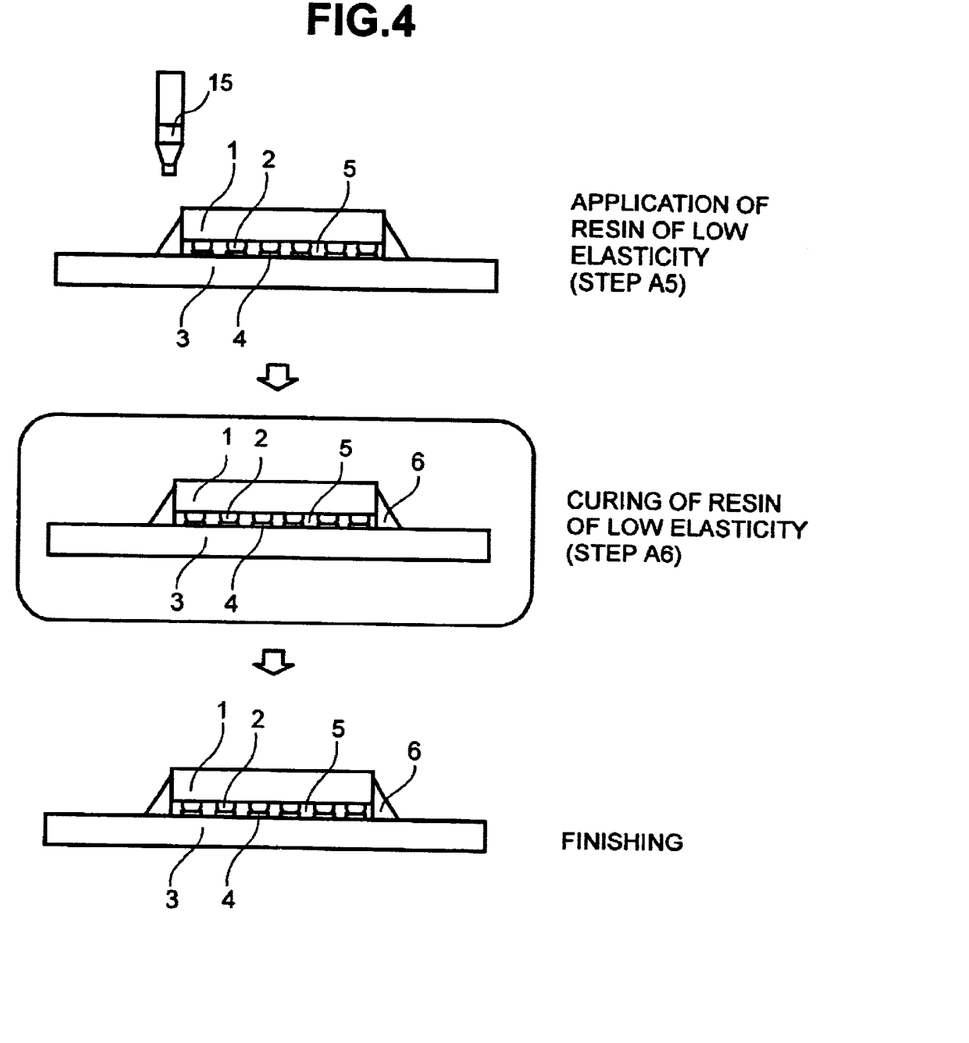
FIG. 4 is a process flow diagram which shows a chip mounting process of an embodiment of the present invention.

Referring to FIGS. 3 and 4, a description follows of a method for mounting a semiconductor integrated circuit chip 1 provided with protruding electrodes 2 atop a circuit substrate 3.

An example of a step preceding the mounting of the semiconductor integrated circuit chip 1 atop the circuit substrate 3 is to gold-plate the terminals of the semiconductor integrated circuit chip 1 and then mount solder balls to thereby form protruding electrodes (solder bumps) 2. Also, when gold is employed, a plating or wire-bonding method is preferably used; when solder is employed, a plating method, a vapor deposition method, a printing method, or a solder ball connection method is preferably used (Step A1).

Next, a resin 5 of high elasticity is applied beforehand using a dispenser 15, to the position at which the semiconductor integrated circuit chip 1 is to be mounted on the circuit substrate 3. At this time, the amount of the resin 5 of high elasticity which is applied is an amount that represents a sufficient quantity of this resin between at least the semiconductor integrated circuit chip 1 and the circuit substrate 3, and is preferably such that the protruding electrodes 2 at the very edge of the outer perimeter are covered (Step A2).

Next, the semiconductor integrated circuit chip 1 is adsorbed by a bonding tool 10, and, with the active chip face of the semiconductor integrated circuit chip 1 oriented downward to face the circuit substrate 3, the substrate electrodes 4 of the circuit substrate 3 and the protruding electrodes 2 of the semiconductor integrated circuit chip1 are aligned so as to be capable of making a direct connection with each other (Step A3).

Next, the semiconductor integrated circuit chip 1 is mounted atop the circuit substrate 3, and, using the bonding tool 10 to which the semiconductor integrated circuit chip 1 is adsorbed, the semiconductor integrated circuit chip 1 is heated and the resin 5 of high elasticity (a heat-curable resin) is cured. Further, in a case where a photo-curable resin is employed, light is applied in place of heat. Also, the time at which the resin 5 of high elasticity is heated is either at the same time as the mounting of the semiconductor integrated circuit chip 1, or after the mounting of the semiconductor integrated circuit chip 1 (Step A4).

Next, using the dispenser 15, a resin 6 of low elasticity is applied to the outer perimeter of the semiconductor integrated circuit chip 1 (Step A5).

Thereafter, the resin 6 of low elasticity (a heat-curable resin) is cured by heating, and resin fillets are formed at the outer perimeter of the semiconductor integrated circuit chip 1. Here, since a heat-curable resin is employed for the resin 6 of low elasticity, this resin is cured under the application of heat, whereas when the resin 6 of low elasticity is a photo-curable resin, the resin is cured by applying light thereto (Step A6).

By performing the above process, it is possible to fabricate a flip chip connection structural body of the kind shown in FIG. 1

Figure 13:
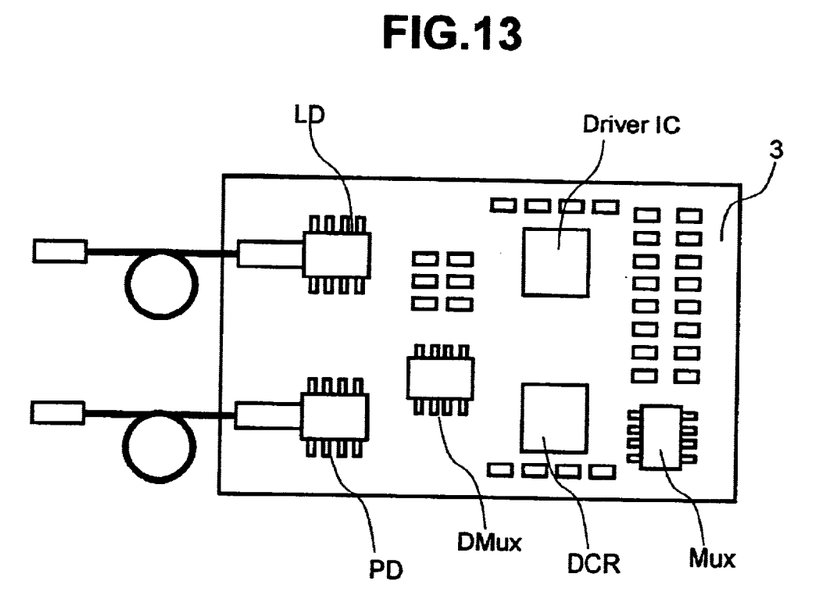
FIG. 13 is a top view of an optical transmission module which employs the electronic substrate of the present invention.

A case where this electronic device is applied to an optical transmission module will now be described with reference to FIGS. 13 and 14. FIG. 13 is a top view of a substrate applied to an optical transmission module which performs the function of producing data in the form of voltage values as light for emission to an optical fiber (transmission function) and the function of converting data in the form of light received from an optical fiber into data in the form of voltage values (receive function); while, FIG. 14 is a block diagram of the functions of the optical transmission module shown in FIG. 13.

The function of producing data in the form of voltage values as light for emission to an optical fiber (the transmission function) is realized using a constitution that comprises an optical module installed in an LD, and a Driver IC. Also, an LD (Laser Diode) is a light-emitting element that converts voltages to light, and the Driver IC used by the LD is an IC that controls voltages applied to the LD. The above-described electronic device structure is adopted for the Driver IC. In other words, the Driver IC and the circuit substrate below are connected using a flip chip method employing solder, a first resin being disposed between the Driver IC and the circuit substrate, and a second resin whose modulus of elasticity is higher than the modulus of elasticity of the first resin being disposed so as to surround the outer perimeter of the Driver IC. Consequently, by applying the connection structure adopted by the above-described electronic device to the Driver IC of an optical transmission module, it is possible to ensure a life of 200,000 hours in an environment such as outdoors on a telephone pole or the like, or in the ground, and to obtain an effect according to which transmission with a high transfer rate of 10 Gbits/s or 40 Gbits/s can be achieved in a straightforward manner.

Figure 14:
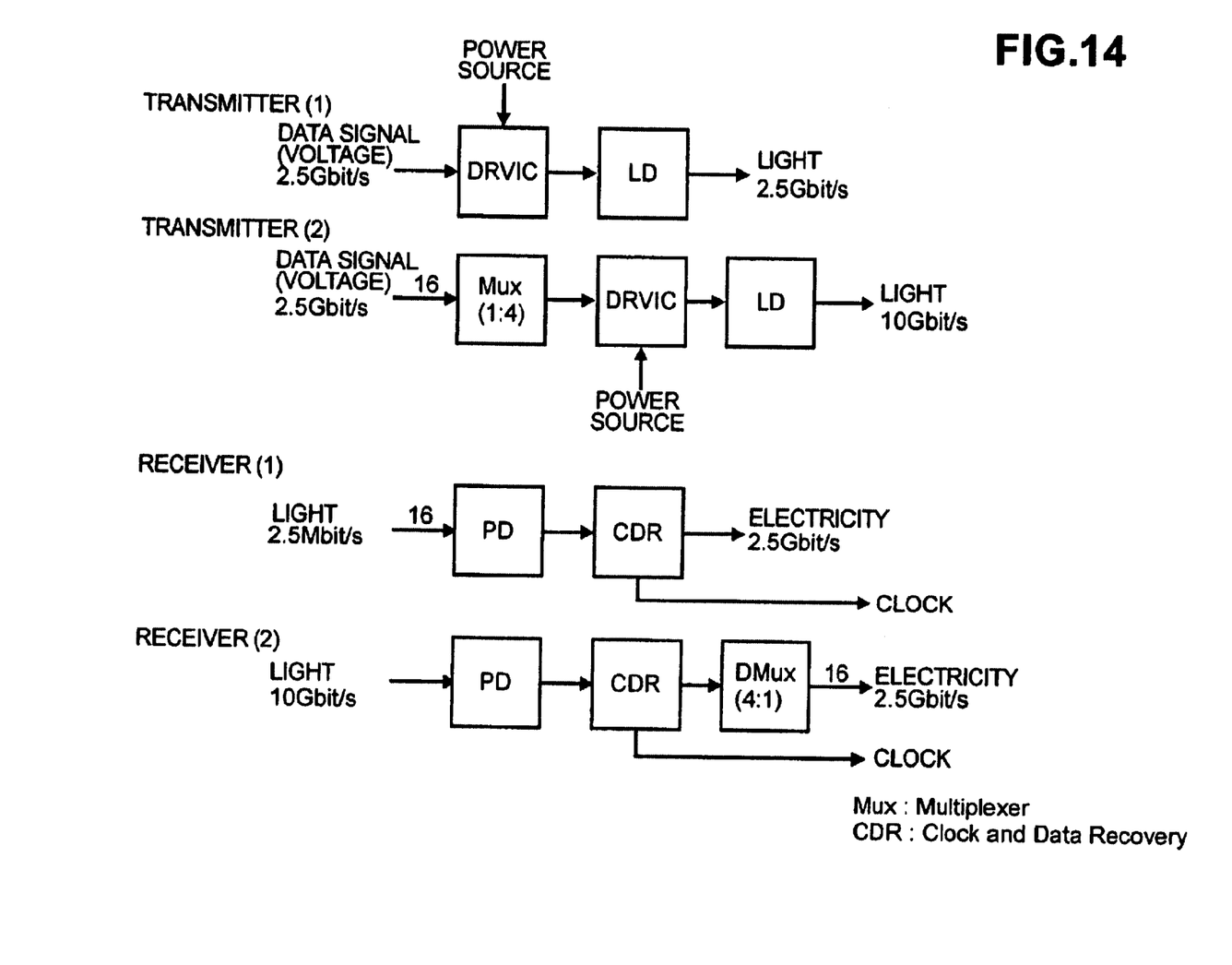
FIG. 14 is a block diagram showing the functions of the optical transmission module of the present invention.

As shown by the transmitter (2) of FIG. 14, through the use of a Mux (Multiplexer) between a Driver IC and an optical fiber, the transmission capacity of the transmission function can be increased.

The function of converting data in the form of light received from an optical fiber into data in the form of voltage values is realized using a constitution that comprises an optical module installed in a PD and a CDR (Clock and Data oRecovery). That is, a PD (photo diode) is a light-receiving element that converts light into voltages, and a CDR is an element that extracts a clock from voltage signals. The above-described electronic device structure is adopted by the CDR. In other words, the CDR and the circuit substrate below are connected using a flip chip method employing solder, a first resin being disposed between the CDR and the circuit substrate, and a second resin whose modulus of elasticity is higher than the modulus of elasticity of the first resin being disposed so as to surround the outer perimeter of the CDR. Consequently, by applying the connection structure adopted by the above-described electronic device to the CDR of an optical transmission module, it is possible to ensure a life of 200,000 hours in an environment such as outdoors on a telephone pole or the like, or in the ground, and to obtain an effect according to which reception with a high transfer rate of 10 Gbits/s or 40 Gbits/s can be achieved in a straightforward manner.

Moreover, in a case where a Mux(Multiplexer) is employed on the transmit function side, as is the case for the transmitter (2) of FIG. 14, a Dmux(D Multiplexer) is employed on the receive function side, as is the case for the receiver (2) of FIG. 14.

Further, the modulus of elasticity of this second resin is between 0.5 GPa and 28 GPa at room temperature, the modulus of elasticity of the second resin is preferably between 1 GPa and 20 GPa at room temperature, and most preferably between 4 GPa and 15 GPa. According to the present invention, it is possible to improve the durability to heat cycles of an electronic device, which comprises an electronic substrate in which a semiconductor integrated circuit chip is connected by means of a flip chip connection atop a circuit substrate, and more particularly of an optical transmission module.

What is claimed is:

1. An electronic device, in which terminals of a semiconductor integrated circuit chip and terminals of a circuit substrate are mounted with solder so as to face one another, comprising:
   a first resin, which is disposed between said circuit substrate and a terminal formation face of said semiconductor integrated circuit chip; and
   a second resin, which is disposed at an outer perimeter of said semiconductor integrated circuit chip or is disposed laterally thereon,
   wherein the modulus of elasticity of said second resin is smaller than a modulus of elasticity of said first resin, the modulus of elasticity of said second resin being at least 0.5 GPa but no more than 28 GPa at room temperature.

2. The electronic device according to claim 1, wherein the modulus of elasticity of said second resin is at least 1 GPa but no more than 24 GPa at room temperature.

3. An optical transmission module, which is equipped with an optical module which has a semiconductor element that converts voltages and light and a driver IC which controls voltages applied to said light-emitting element, and in which terminals of said driver IC and wiring terminals of the circuit substrate are soldered together in a position so as to face one another, comprising:
   a first resin, which is disposed between said circuit substrate and a terminal formation face of said driver IC; and
   a second resin, which is disposed at an outer perimeter of said driver IC or is disposed laterally thereon,
   wherein a modulus of elasticity of said second resin is smaller than a modulus of elasticity of said first resin, the modulus of elasticity of said second resin being at least 0.5 GPa but no more than 28 GPa at room temperature.

4. The optical transmission module according to claim 3, wherein the modulus of elasticity of said second resin is at least 1 GPa but no more than 20 GPa at room temperature.

5. The electronic device according to claim 1, wherein the modulus elasticity of said second resin is at least 1 GPa but no more than 20 GPa at room temperature.

6. The optical transmission module according to claim 3, wherein the modulus elasticity of said second resin is at least 1 GPa but no more than 24 GPa at room temperature.

* * * * *